United States Patent
Houston

(10) Patent No.: US 7,710,763 B2
(45) Date of Patent: May 4, 2010

(54) SRAM CELL USING SEPARATE READ AND WRITE CIRCUITRY

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/337,258

(22) Filed: Dec. 17, 2008

(65) Prior Publication Data

US 2009/0103375 A1    Apr. 23, 2009

Related U.S. Application Data

(62) Division of application No. 11/202,141, filed on Aug. 11, 2005, now Pat. No. 7,483,332.

(51) Int. Cl.
*G11C 5/06* (2006.01)
*G11C 11/41* (2006.01)

(52) U.S. Cl. ............. 365/154; 365/230.05; 365/189.14; 365/156; 365/72; 365/63

(58) Field of Classification Search ................ 365/154, 365/230.05, 189.04, 156, 203, 204, 189.14, 365/63, 72
See application file for complete search history.

(56) References Cited

U.S. PATENT DOCUMENTS 5,040,146 A *  8/1991  Mattausch et al. .......... 365/154
5,355,335 A    10/1994 Katsuno
5,793,669 A     8/1998 Sheffield et al.
5,826,056 A *  10/1998 Noda ........................ 711/167
5,828,610 A *  10/1998 Rogers et al. ............... 365/203
6,005,796 A    12/1999 Sywyk et al.
6,711,086 B2    3/2004 Terada
2002/0001251 A1*  1/2002 Fujino et al. ........... 365/230.08
2003/0076731 A1   4/2003 Terada
2003/0189221 A1  10/2003 Takemura
2004/0156228 A1   8/2004 Becker

OTHER PUBLICATIONS

Chang, et al. "Stable SRAM Cell Design for the 32 nm Node and Beyond" 2005 Symposium on VLSI Technology Digest of Technical Papers; pp. 128-129.

* cited by examiner

*Primary Examiner*—J. H. Hur
(74) *Attorney, Agent, or Firm*—Rose Alyssa Keagy; W. James Brady; Frederick J. Telecky, Jr.

(57) ABSTRACT

An SRAM device that includes an array of SRAM cells arranged in rows and columns. The SRAM device also includes a word line associated with at least one row, the word line operable to control access to cells in the row for both read and write. In addition, the SRAM device includes a write bit-line associated with at least one column operable to provide input to the cells in the column for write. Furthermore, the SRAM device includes a read bit-line associated with the column operable to receive output from cells in the column.

17 Claims, 6 Drawing Sheets

SRAM CELL USING SEPARATE READ AND WRITE CIRCUITRY

This is a divisional application of Ser. No. 11/202,141 filed Aug. 11, 2005.

TECHNICAL FIELD OF THE INVENTION

The present invention is directed, in general, to static random-access memory (SRAM) and, more specifically, to SRAM having read transistors associated with each storage cell.

BACKGROUND OF THE INVENTION

Different types of memory are used in electronic apparatus for various purposes. Read-only memory (ROM) and random-access memory (RAM) are two such types of memory commonly used within computers for different memory functions. ROM retains its stored data when power is switched off and therefore is often employed to store programs that are needed for powering-up an apparatus. ROM, however, cannot generally be changed. RAM, on the other hand, allows data to be written to, or read from, selected addresses associated with memory cells and, therefore, is typically used during normal operation of the apparatus.

Two common types of RAM are dynamic RAM (DRAM) and static RAM (SRAM). DRAM is typically used for the main memory of computers or other electronic apparatus since, though it must be refreshed, it is less expensive and requires less chip space than SRAM. Though more expensive and space consuming, SRAM does not require refresh, making it faster. These attributes make SRAM devices particularly desirable for portable equipment, such as laptop computers and personal digital assistants (PDAs).

A typical SRAM device is designed to store thousands of bits of information. These bits are stored in individual cells, organized as rows and columns to make efficient use of space on the semiconductor substrate on which the SRAM is fabricated. A commonly used cell architecture is known as the "6T" cell, by virtue of having six MOS transistors. Four transistors defining an SRAM cell core are configured as cross-coupled inverters, which act as a bistable circuit, indefinitely holding the state imposed onto it while powered. Each inverter includes a load transistor and a driver transistor. The output of the two inverters will be in opposite states, except during transitions from one state to another. Two additional transistors are known as "pass" transistors, which provide access to the cross-coupled inverters during a read operation (herein referred to as READ) or write operation (herein referred to as WRITE). The gate inputs of the pass transistors are typically connected in common to a "word line," or WL. The drain of one pass transistor is connected to a "bit-line," or BL, while the drain of the other pass transistor is connected to the logical complement of the bit-line, or BL_.

A WRITE to a 6T cell is effected by asserting a desired value on the BL and a complement of that value on BL_, and asserting the WL. Thus, the prior state of the cross-coupled inverters is overwritten with a current value. A READ is effected by first precharging both bitlines to a logical high state and then asserting the WL. In this case, the output of one of the inverters in the SRAM cell will pull one bitline lower than its precharged value. A sense amplifier detects the differential voltage on the bitlines to produce a logical "one" or "zero," depending on the internally stored state of the SRAM cell.

A consideration in the design of the transistors in the SRAM cell is the geometric parameters of the transistors. The gate length and width determine in large part the speed and saturation drive current, $I_{Dsat}$, also known as the maximum drive current capacity of the transistors. Appropriate values of gate length and width of the six transistors of the 6T cell must be chosen to ensure that a read operation does not destroy the previously stored datum. Inappropriate transistor parameter values in conjunction with the BL and WL voltages applied during a READ may result in a change in state of the memory cell due to random asymmetries resulting from imperfections in the manufacturing process. The necessity to guard against such READ instability places an undesirable constraint on the design parameters of the transistors in the 6T cell, limiting the ability of the designer to increase READ performance of the SRAM while keeping within area and power constraints and maintaining the ability to write into the cell.

A constraint on the design of a 6T SRAM cell is that the pass gate is generally designed to be relatively weaker than the inverter driver transistor to ensure stability, but relatively stronger than the inverter load transistor to enable a WRITE. Also, for stability, the inverter load transistor cannot be too weak relative to the inverter driver transistor. Inverter transistors with relatively low threshold voltage ($V_t$), the voltage at which the transistor begins to conduct, may also degrade stability of the SRAM cell.

Prior art includes methods to assist the WRITE to allow the relatively weaker pass gate for good stability. This prior art includes pulling the BL below the SRAM low voltage supply, $V_{SS}$, for WRITE, or providing a lower SRAM high voltage supply, $V_{DD}$, to the inverters for WRITE relative to that for READ. However, the relatively weaker pass gate enabled by this prior art has the undesirable affect of degrading the read current.

Prior art also includes memory cells with separate ports for READ and WRITE that might at first seem to relax some of the constraints to allow a fast READ. However, such cells are generally relatively large. Also there is still the constraint of not upsetting the unaddressed cells in a selected row for WRITE in an array in which only a subset of the cells in a selected row are written into in a single WRITE cycle. The cells in the selected row that are not written into are subjected to bias conditions similar to that for a READ, and are subject to upset.

Accordingly, what is needed in the art is an SRAM cell design that relaxes the constraints on the SRAM cell transistor design parameters to enable higher speed SRAM designs with a relatively compact layout.

SUMMARY OF THE INVENTION

To address the above-discussed deficiencies of the prior art, the present invention provides circuitry for writing to and reading from an SRAM cell core, an SRAM cell, and an SRAM device. In one aspect, the circuitry includes a write circuit coupled to the SRAM cell core that includes at least one write transistor having an electrical characteristic. The circuitry also includes a read circuit coupled to the SRAM cell core that includes at least one read transistor having an electrical characteristic, for which the electrical characteristic of the read transistor differs from that of the write transistor. In addition, the write transistor and the read transistor have a common gate signal.

In another aspect, the present invention provides for an SRAM cell that has a pair of cross-coupled inverters, and a write transistor gated by a word line and coupled between the output of one of the cross-coupled inverters and a write bitline. The SRAM cell also has a read transistor gated by the word line and coupled between a read bit-line and a read drive transistor. The read drive transistor is coupled between the read transistor and a voltage source, and is gated by an output of one of the cross-coupled inverters.

In yet another aspect, the present invention provides an SRAM device, including an array of SRAM cells arranged in rows and columns. A word line is associated with at least one row, and is operable to control access to cells in the row for both read and write. A write bit-line is associated with at least one column, and is operable to provide input to the cells in the column for a write. A read bit-line is associated with the column operable to receive output from cells in the column.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the invention, reference is now made to the following descriptions taken in conjunction with the accompanying drawing, in which.

DETAILED DESCRIPTION

Figure 1:
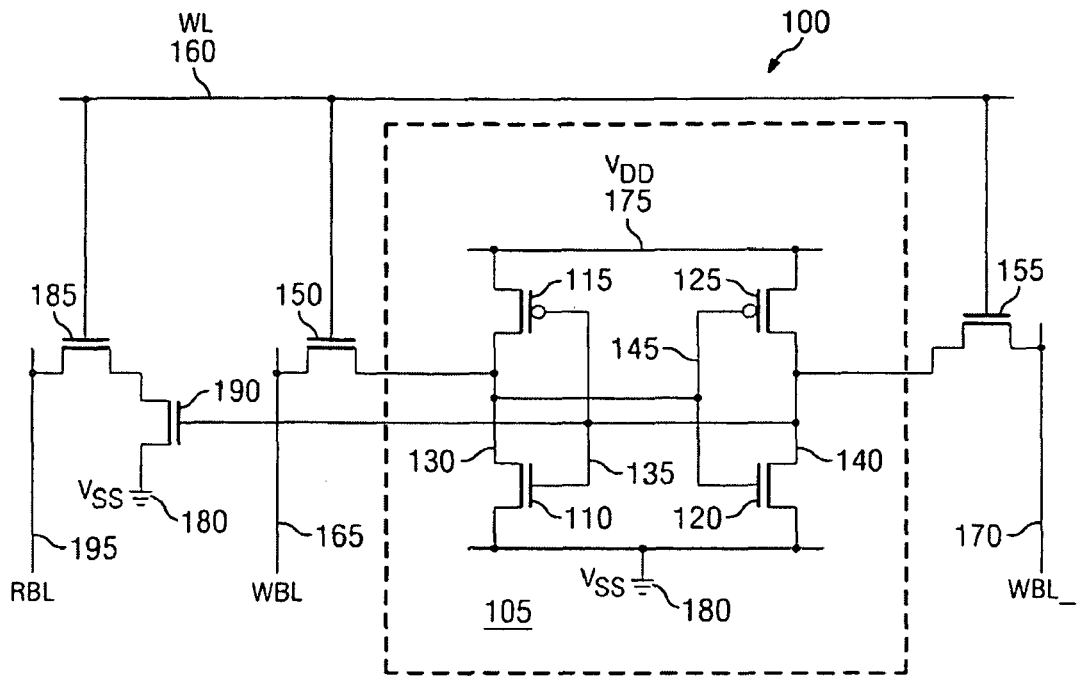
FIG. 1 illustrates an eight-transistor (8T) SRAM cell comprising an SRAM cell core, and circuitry for writing to and reading from the SRAM cell core, according to the principles of the present invention.

Referring initially to FIG. 1, shown is an eight-transistor (8T) SRAM cell 100 comprising an SRAM cell core 105, and circuitry for writing to and reading from the SRAM cell core, according to the principles of the present invention. SRAM cell core 105 is a conventional design using two inverters. A first inverter comprises a first driver transistor 110 and a first load transistor 115. A second inverter comprises a second driver transistor 120 and a second load transistor 125. In this conventional embodiment of SRAM cell core 105, the driver transistors 110 and 120 are n-channel MOSFETs, and the load transistors 115 and 125 are p-channel MOSFETs.

The first inverter has a first output 130 formed by a connection between the drain of the first load transistor 115 and the drain of the first driver transistor 110, and a first input 135 formed by a connection between the gate of the first driver transistor 110 and the gate of the first load transistor 115. Similarly, the second inverter has a second output 140 formed by a connection between the drain of the second load transistor 125 and the drain of the second driver transistor 120, and a second input 145 formed by a connection between the gate of the second load transistor 120 and the gate of the second driver transistor 125. In a conventional manner, the first and second inverters are cross-coupled, meaning that the output of each inverter is connected to the input of the other, to form an SRAM cell core that stores a single bit of information.

Also in a conventional manner, a write transistor 150 is connected to the first output 130. Similarly, a complementary write transistor 155 is connected to the second output 140. The gates of write transistor 150 and complementary write transistor 155 are each connected to a wordline (WL) 160. Together, the write transistor 150 and the complementary write transistor 155 form a write circuit that is used to impose a state on the SRAM cell 100 in cooperation with the WL 160, a write bit-line (WBL) 165 and a complementary write bit-line (WBL_) 170. For example, if the WBL 165 is set to a value of $V_{DD}$ 175 while the WBL_ 170 is set to value of $V_{SS}$ 180, then, when the WL 160 is asserted (set to $V_{DD}$), the output of the first inverter 130 will be set to a value of $V_{DD}$ plus the drain-source voltage of load transistor 115, while the output of the second inverter 145 will be set to $V_{SS}$ plus the drain-source voltage of driver transistor 120. This state may be interpreted as a logical "one" for the SRAM cell core 105. It is immediately apparent that repeating this operation with the WBL 165 set to $V_{SS}$ and the WBL_ 170 set to $V_{DD}$ would result in setting the SRAM core cell 105 to a logical "zero."

In one embodiment of the invention, a state of the SRAM cell core 105 can be determined by using a read circuit including a read transistor 185 and a read drive transistor 190. In the embodiment shown in FIG. 1, the gate of the read drive transistor 190 is connected to the second output 140 of the second inverter. A source of the read transistor 185 is connected to a drain of the read drive transistor 190, and a drain of the read transistor 185 is connected to a read bit-line (RBL) 195. The gate of the read transistor 185 is connected to the word line (WL) 160, thus making the gate signals of write transistor 150 and read transistor 185 in common. The use of a common word line for both READ and WRITE simplifies the peripheral circuit design in a memory device comprising SRAM cell 100 and allows a compact cell layout.

When the SRAM cell core 105 is storing a logical zero, the output of the second inverter is high, thereby turning on the read drive transistor 190, and forming a low resistance path from the drain of the read drive transistor 190 to $V_{SS}$ 180. The state of the SRAM cell 100 may be determined by precharging the state of the RBL 195 to approximately $V_{DD}$ and asserting the WL 160. Alternatively, the RBL 195 may be precharged to a voltage lower than $V_{DD}$ to reduce power consumed by the READ. Because the read drive transistor 190 is on, when the read transistor 185 is turned on by asserting the WL 160, the RBL 195 is pulled below its precharge voltage. However, if the SRAM cell 100 is set to a logical one, then the output of the second inverter is a logical zero, and the read drive transistor 190 will be off. When the WL 160 is asserted, the read transistor 185 is turned on, but the RBL 190 remains at the precharge voltage, or logical one.

Those skilled in the art of SRAM cell design will appreciate that the electrical characteristics of the inverter transistors and write transistors are balanced to optimize the stability of the SRAM cell 100. If both read and write functions were provided by the write transistor 150 and the complementary write transistor 155, the time required for a read operation would be constrained by the maximum drive current ($I_{Dsat}$), and turn-on time of the write transistor 150 and the complementary write transistor 155. However, the present invention advantageously allows the maximum drive current or threshold voltage of the read transistor 185 to be designed substantially independently of the constraints on SRAM cell stability. Thus, the read transistor 185 can be designed with different electrical characteristics than the write transistor 150.

In one embodiment, the read transistor 185 is designed to have a larger $I_{Dsat}$ than the write transistor 150. In an alternate embodiment, the read transistor 185 is designed to turn on faster than does the write transistor 150. In yet another embodiment, the threshold voltage of read transistor 185 is designed to be lower than the threshold voltage of write transistor 150. One skilled in the art will appreciate that these embodiments can be combined as desired to result in the desired SRAM performance.

Those skilled in the pertinent art will also appreciate that in another alternate embodiment, the read circuitry could be designed using complementary transistor polarity. For example, the read transistor 185 could be a p-channel transistor. In this embodiment, the drain of the read transistor 185 is connected to the drain of the read drive transistor 190, and the source of the read transistor 185 is connected to the RBL 195. The WL 160 is then asserted as a logical zero, thereby turning on read transistor 185 during a READ. In another embodiment, read drive transistor 190 is also implemented as a p-channel transistor, with its source connected to $V_{DD}$ 175. In this embodiment, the RBL 195 is precharged low, and pulled up to a logical one when a low voltage at the second inverter output 140 turns on the read drive transistor 190 (thereby making the read drive transistor 190 a pull-up transistor).

Figure 2:
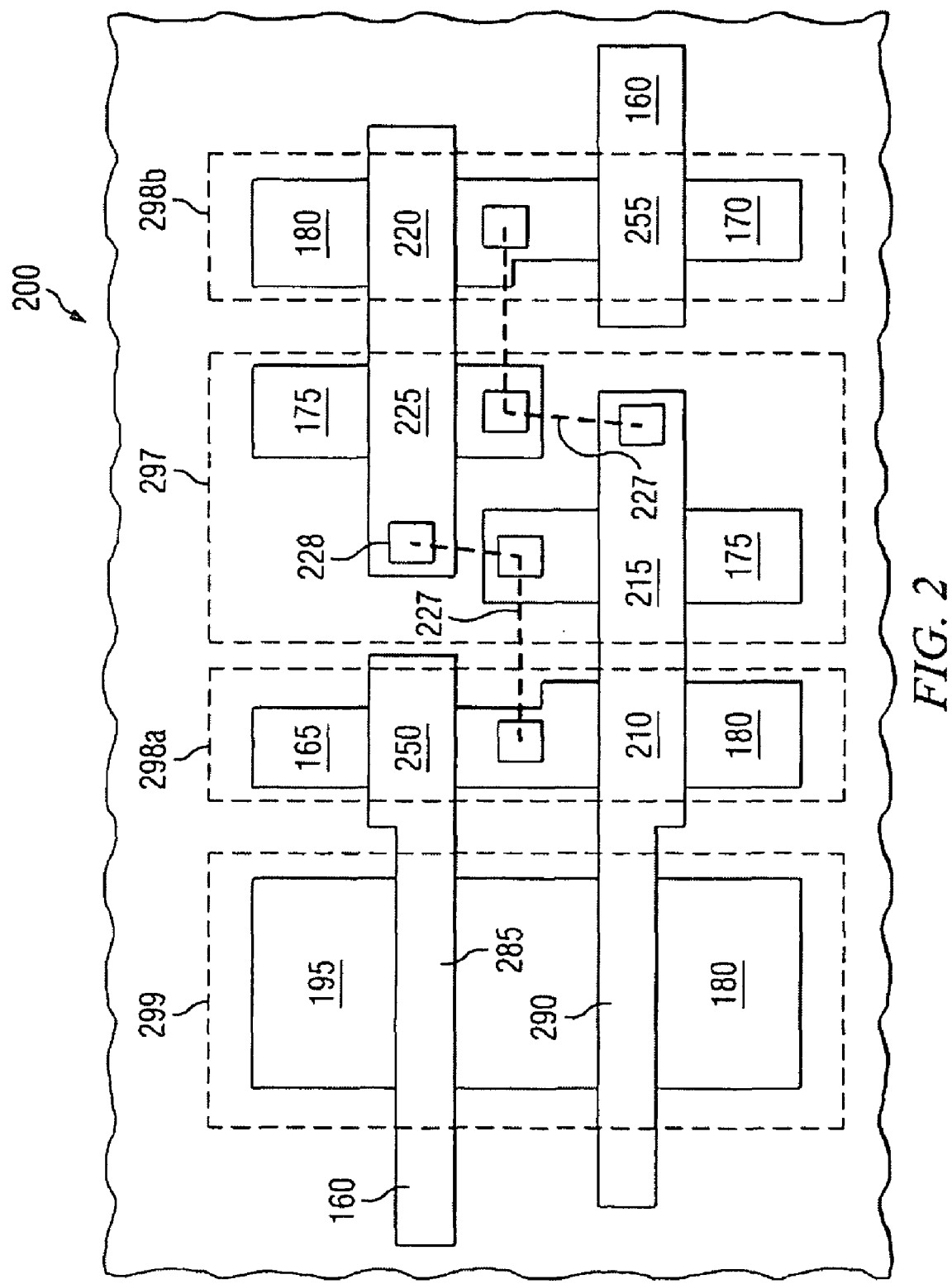
FIG. 2 illustrates an exemplary physical layout on a semiconductor substrate of the SRAM cell with read and write circuitry shown in FIG. 1.

Turning now to FIG. 2, an exemplary physical layout 200 on a semiconductor substrate is shown of the SRAM cell with read and write circuitry shown in FIG. 1. For clarity, only the active and gate structures and a schematic indication of the interconnection of the inverters are shown. The layout of the bit-lines, word lines and power supply lines can follow standard design familiar to those skilled in the art of SRAM design. The SRAM core cell 105 comprises a first driver transistor 210 and a first load transistor 215, and a second driver transistor 220 and a second load transistor 225, as well as interconnects 227 and vias 228. The first driver transistor 210 and a write transistor 250 share a p-well, as do the second driver transistor 220 and a complementary write transistor 255. Additionally, a read transistor 285 and a read drive transistor 290 share another p-well. The gates of the first driver transistor 210, the first load transistor 215 and the read drive transistor 290 have a common gate structure, meaning they are coupled using a single strip of gate material, e.g., polysilicon. Similarly, the gates of the second driver transistor 220 and the second load transistor 225 have a common gate structure, as do the gates of the write transistor 250 and the first read transistor 285. The width of the gates of the read transistor 285 and the read drive transistor 290 are shown to be equal, though those skilled in the art will recognize that these gate widths could be designed to be different and remain in the spirit of the present invention.

The gate width of the read transistor 285 is shown in the embodiment of FIG. 2 as greater than the gate width of the write transistor 250. In this manner, read transistor 285 has a larger maximum drive current than does the write transistor 250, and a faster read operation is provided than would be the case if the write transistor 250 were also used as a read transistor. Also, the gate length of the read transistor 285 is drawn shorter than the gate length of the write transistor 250, providing a faster turn-on for the read transistor 285 than for the write transistor 250. Alternatively, or in combination with the lower gate length, the threshold voltage of the read transistor 285 may be designed to be lower than that of the write transistor 250 to result in a faster turn-on of the read transistor 285. Those skilled in the art of SRAM design will recognize that these design options may be combined as desired to meet the design constraints of the circuit.

In the embodiment of FIG. 2, the gate lengths of the transistors making up the cross-coupled inverters (e.g., the driver transistors 210, 220, and the load transistors 215, 225), and the WRITE transistors 250 and 255 are advantageously drawn longer than the minimum gate length available in the semiconductor technology being used, to reduce variability either from process variation or from any random variation in channel doping. Such variation in the transistors of the cross-coupled inverters and the WRITE transistors can significantly increase the likelihood of upsetting the state of the SRAM core cell when the cell is accessed. Analogous variation in the READ transistors 285 and read drive transistors 290 does not have such a serious degrading effect. Thus transistors 285 and 290 can advantageously be designed with minimum gate length.

The physical layout of FIG. 2 is shown with regions 297, 298a, 298b and 299 defined. The region 297 comprises the first load transistor 215 and the second load transistor 225. The region 298a comprises the first driver transistor 210 and the write transistor 250, while the region 298b comprises the second driver transistor 220 and the complementary write transistor 255. The region 299 comprises the read transistor 285 and the read drive transistor 290. The layout of regions shown in FIG. 2 results in the positioning on the substrate of first driver transistor 210 substantially between the read transistor 285 and the first load transistor 215. Such a relative positioning of the physical elements of an SRAM designed according the principles of the present invention is but one of several possible embodiments. Additional embodiments are discussed in the context of FIG. 3.

Figure 3A:
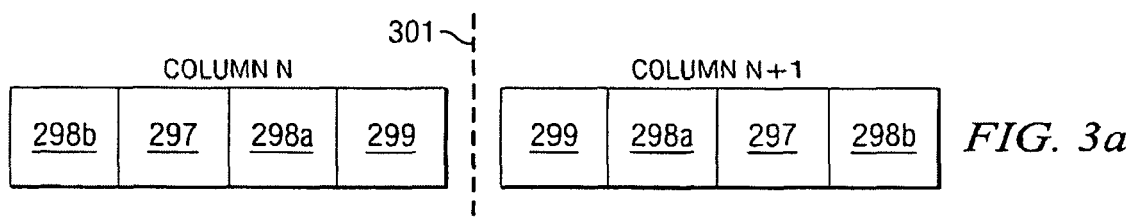
FIG. 3 illustrates schematically two embodiments of two columns of an SRAM device row using the regions defined in FIG. 2.

In FIG. 3, two columns of a row of an SRAM device are shown schematically using the regions shown in FIG. 2. FIG. 3a illustrates two columns of one row of an SRAM device using the exemplary physical layout 200. In a conventional SRAM design, cells in neighboring columns are typically physically placed in mirror image, denoted by mirror symmetry line 301. Hence, in FIG. 3a, the region 299 of an SRAM cell in column N is placed adjacent to the region 299 of an SRAM cell in column N+1. In a similar manner, the region 298b of an SRAM cell in column N+1 is physically placed adjacent to region the 298b of an SRAM cell in column N+2 (not shown). This embodiment places the read transistor 285 of the SRAM cell in column N on the right side of its cell, and the read transistor 285 of the SRAM cell in column N+1 on the left side of its cell. Alternatively, alternate cell layouts can be used to have the read transistors 285 on the same side of their respective cells, either left or right, in adjacent columns.

Figure 3B:
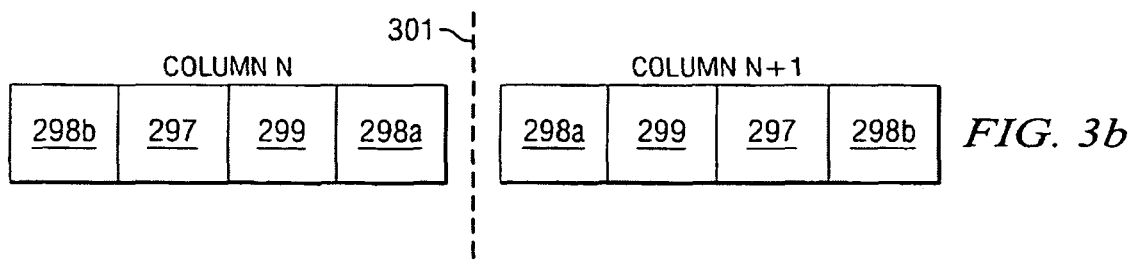

Because the read transistor in an SRAM cell designed according to the invention may have a larger drive current and lower turn-on time (with resultantly lower voltage rise time), the layout of FIG. 3a may result in undesirable reactive coupling between the RBLs of SRAM cells in adjacent columns in an SRAM device. Such coupling may result in decreased noise margins in the SRAM device design. To reduce such coupling between cells, the position of the regions 298a and 299 may be reversed in an alternate embodiment as shown in FIG. 3b. This configuration places the read transistor 285 substantially between the first driver transistor 210 and the first load transistor 215, reducing coupling between the read transistor of an SRAM cell in one column from the transistors of an SRAM cell in an adjacent column. In this manner, noise margins of the SRAM device may be advantageously increased. In both the layout of FIG. 3a and the layout of FIG. 3b, the read transistor 285 is advantageously placed adjacent to the write transistor 250, with the read transistor 285 and the write transistor 250 sharing a common gate. Also, the read drive transistor 290 is placed adjacent to the first driver transistor 210, with the read drive transistor 290 and the first driver transistor 210 also sharing a common gate.

Figure 4:
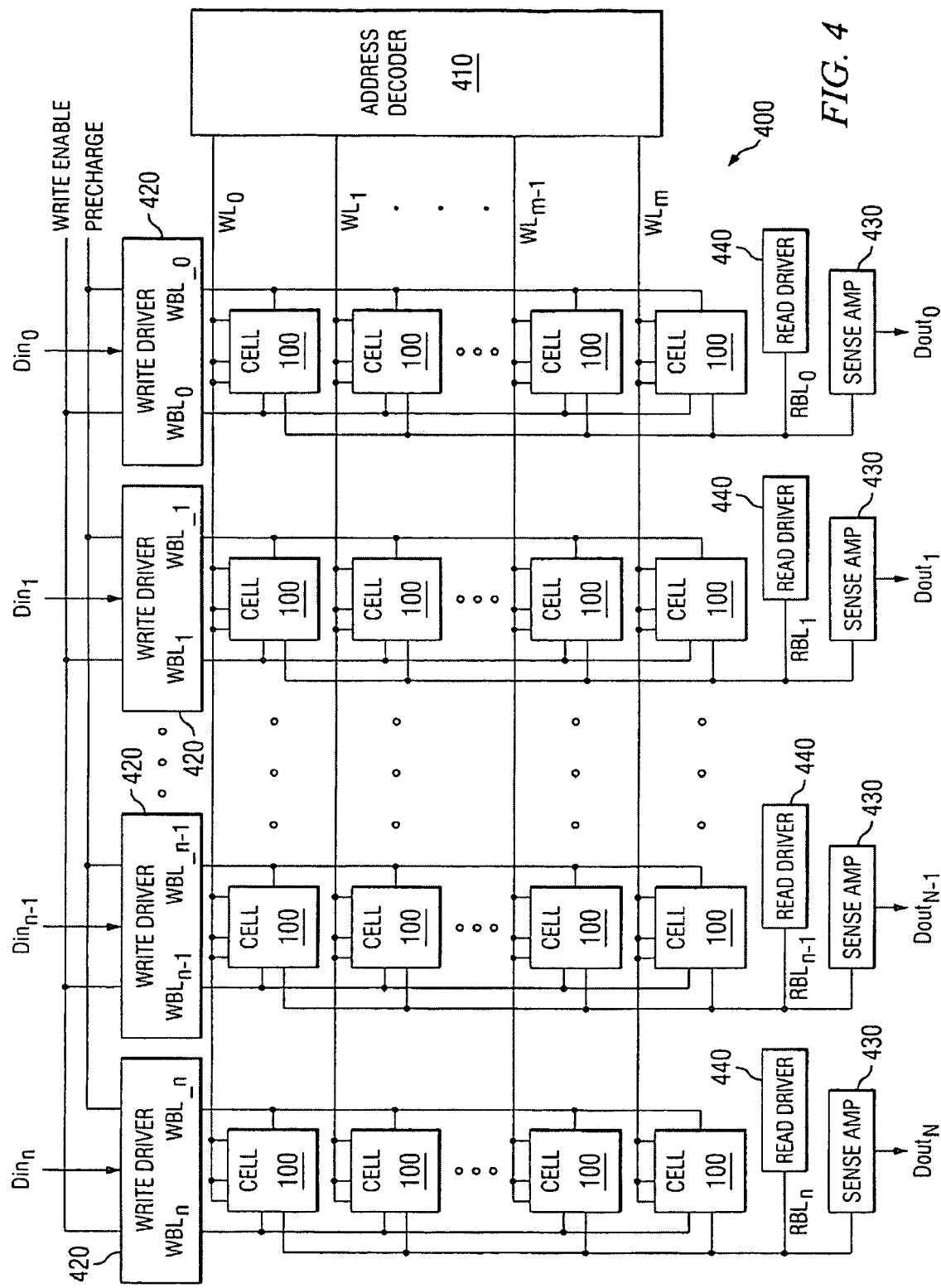
FIG. 4 illustrates a schematic of an SRAM device architecture that utilizes the 8T SRAM cell illustrated in FIG. 1, designed according to the principles of the invention.

Turning now to FIG. 4, an SRAM device 400 is shown having SRAM cells 100 designed according to the principles of the invention. The SRAM device 400 comprises a conventional address decoder 410, a plurality of write drivers 420, sense amplifiers 430, read drivers 440, and potentially a large number of SRAM cells 100. Address decoder 410 outputs a number of word lines, $WL_0, WL_1, \ldots WL_{m-1}, WL_m$, connecting each of m rows of SRAM cell 100. Each write driver 420 generates a WBL and WBL_ signal, these signals connecting the SRAM cells 100 in each of n columns. In this manner, each SRAM cell 100 can be written to and read from by appropriate choice of m and n.

In a READ cycle, WBL and WBL_ are held at a voltage that will not cause upset of the memory cells. In one embodiment, the maximum WBL and WBL_ voltage is the array high supply voltage, $V_{DD}$. In another embodiment, the maximum WBL and WBL_ voltage is reduced below $V_{DD}$ by approximately the threshold voltage of an n-channel transistor, $V_{tn}$. The latter embodiment increases cell stability, but would have the undesirable affect of reducing the read current in a conventional 6T SRAM cell. Using an 8T SRAM cell according to the principles of the present invention results in substantially no reduction of read current.

When a WRITE is performed, in an exemplary embodiment, one of WBL and WBL_ is driven low. In another exemplary embodiment, the other of WBL and WBL_ is driven high. In yet another exemplary embodiment, one of WBL and WBL_ is driven lower than $V_{SS}$ to assist the WRITE if the cell is designed with a weak write transistor 150 and complementary write transistor 155, as might be done for increased stability of the SRAM cell 100.

Additionally, in accordance with the invention, a plurality of read drivers 440 are shown in FIG. 4. Each read driver 440 also connects to the SRAM cells 100 in each of the n columns. In this exemplary embodiment, the read drivers 440 precharge the RBL lines in coordination with the assertion of the WL corresponding to the row of the SRAM cell 100 being read from. Optionally, the RBLs are precharged only in a READ cycle. In another embodiment, only a subset of the plurality of cells on the selected row are read from and optionally only the RBLs associated with the subset of cells to be read from are precharged. In yet another embodiment, the voltages on the RBLs not associated with the subset of cells to be read from are not precharged, but are allowed to float or are held at a voltage that is substantially equal to the source voltage of the read transistors 185. Leakage current is advantageously reduced by floating the RBLs or holding the RBLs substantially at the same voltage as the source voltage of the read transistor when not in a READ cycle or when the RBL is not associated with a cell to be read from. This enables use of read and read drive transistors having low threshold voltage with minimal negative impact on power consumption. A sense amplifier 430 then determines the state of the SRAM cell 100 of interest by converting to a digital value a voltage change on the RBL line due to the state of the SRAM cell 100 being read from.

Figure 5:
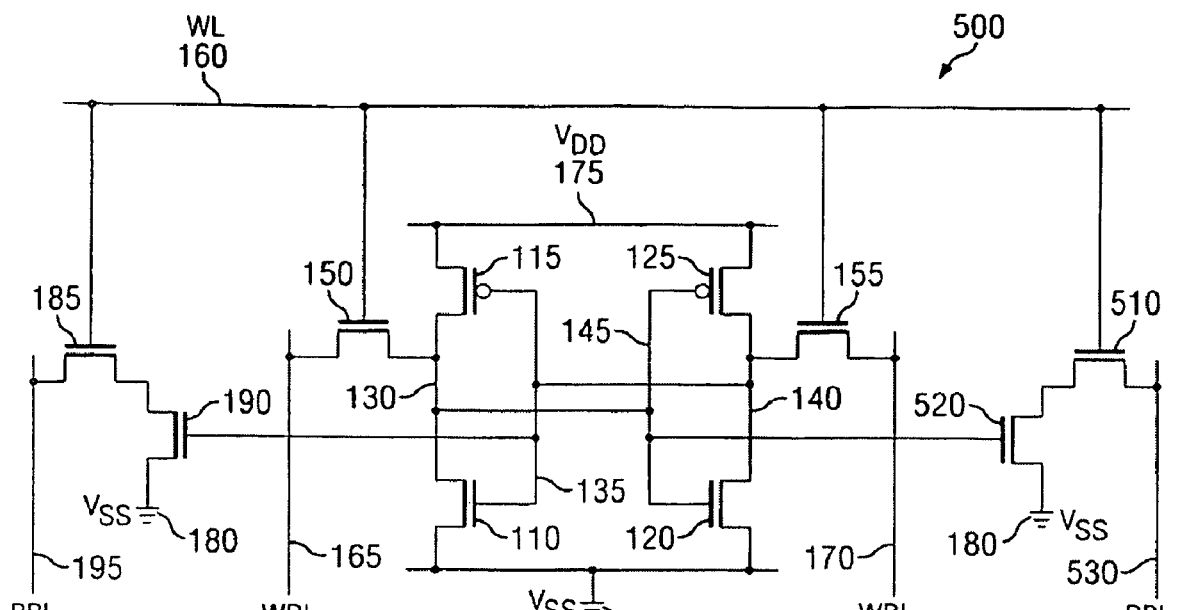
FIG. 5 illustrates an embodiment of a 10T SRAM cell designed according the principles of the invention.

Turning now to FIG. 5, illustrated is a 10T SRAM cell 500 designed according to the principles of the invention. In this embodiment, a complementary read transistor 510 and a complementary read drive transistor 520 are added to the embodiment shown in FIG. 1 to form a 10T SRAM cell. The source of the complementary read transistor 510 is connected to the drain of the complementary read drive transistor 520. The gate of the complementary read drive transistor 520 is connected to the output 130 of the first inverter, and the drain of the complementary read transistor 510 is connected to complementary read bit-line, RBL_ 530. If a precharge is used, RBL_ 530 is precharged to a voltage of about $V_{DD}$ or a voltage lower than $V_{DD}$ to reduce power consumption. The complementary read transistor 510 is shown in FIG. 5 as an n-channel transistor.

As for the embodiment of FIG. 1, one skilled in the pertinent art will recognize that the read transistor 510 and the read drive transistor 520 could be implemented as p-channel transistors. If so, electrical connections would be made in a manner analogous to those described in the discussion of FIG. 1.

In the embodiment shown in FIG. 5, when the WL 160 is asserted, the RBL 195 will reflect the state of the first inverter, and the RBL_ 530 will reflect the state of the second inverter. The state the SRAM cell 500 is then determined by converting the differential voltage between RBL 195 and RBL_ 530 to a digital value. This embodiment offers advantageous noise immunity over the embodiment of FIG. 1, and generally a faster READ in large arrays in which there is a relatively large capacitance on the RBLs 195 and RBL_s 530, since a relatively smaller voltage swing is needed for differential sensing.

Figure 6:
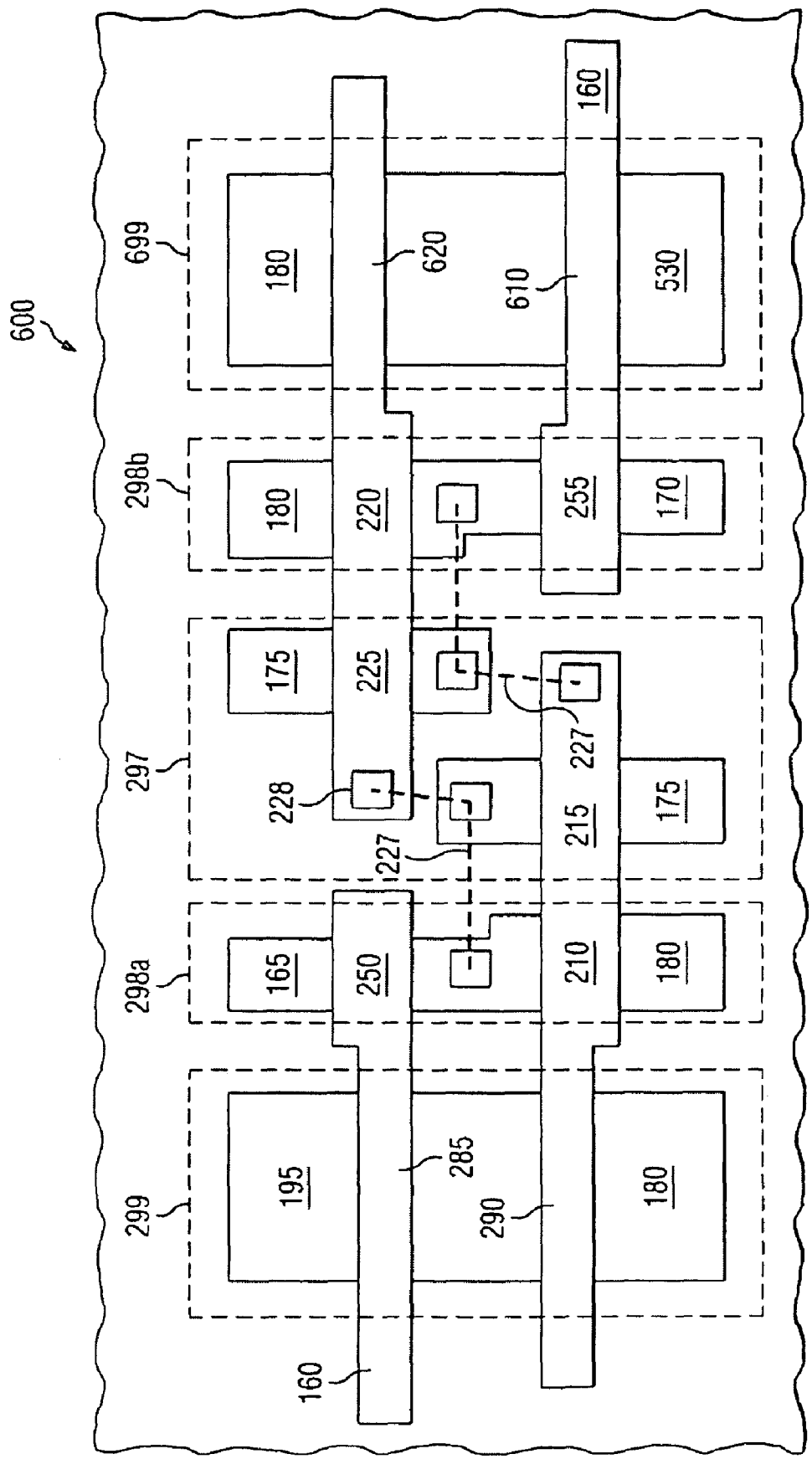
FIG. 6 illustrates an exemplary physical layout on a semiconductor substrate of the SRAM cell with read and write circuitry shown in FIG. 5.

In FIG. 6, an exemplary embodiment of a physical layout 600 using the 10T SRAM design 500 is shown. This embodiment is identical to that shown in FIG. 2, with the addition of a complementary read transistor 610 and a complementary read drive transistor 620. In addition, region 699 is defined as containing the geometry associated with these additional transistors. The remaining regions are defined as they were for FIG. 2.

Figure 7A:
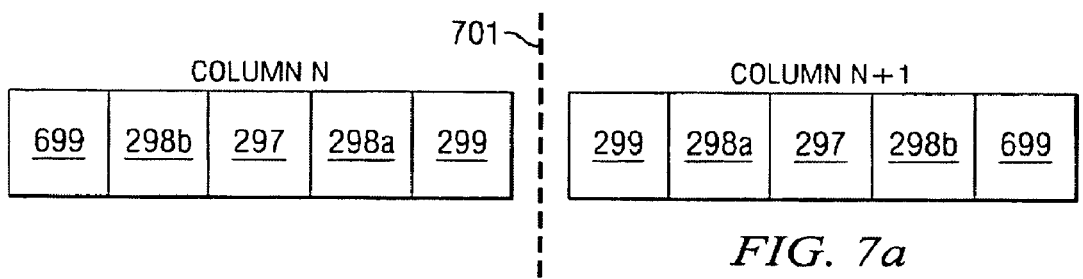
FIG. 7 illustrates schematically three embodiments of two columns of an SRAM device row using the regions defined in FIG. 6.

Turning now to FIG. 7a, the physical layout of FIG. 6 is shown schematically using the regions defined in FIG. 6. In FIG. 7a, two columns of an exemplary SRAM device layout are shown, as in FIG. 3, with a mirror symmetry line 701 defining a line about which two columns may be mirrored in an SRAM device. In the embodiment of FIG. 7a, the regions 299 of neighboring SRAM cells are adjacent to each other, as are the regions 699. Thus, the read transistor 285 of the SRAM cell in column N is in close proximity with the read transistor 285 of the SRAM cell in column N+1, and the complementary read transistor 610 of the SRAM cell in column N+1 is in close proximity to the complementary read transistor 610 of the SRAM cell in column N+2 (not shown). Such a configuration may again result in undesirable reactive coupling between pairs of read transistors, decreasing noise margin of the SRAM cell.

Figure 7B:
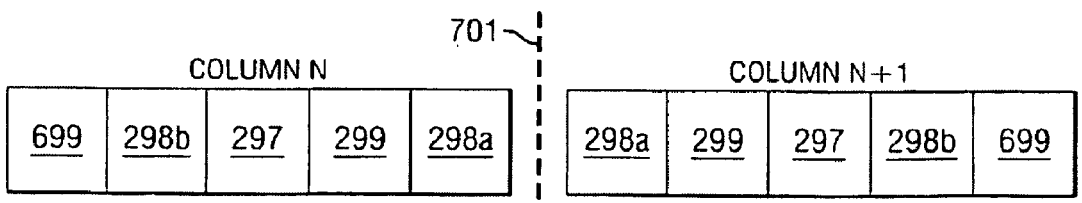

In the embodiment of FIG. 7b, the positions of regions 298a and 299 are reversed, so that the read transistor 285 is positioned substantially between the first driver transistor 210 and the first load transistor 215. As set forth in the discussion of FIG. 3, this configuration results in a decrease of coupling between the read transistors 285 of neighboring cells, but leaves the complementary read transistors 610 of alternate pairs of neighboring cells in close proximity, with associated higher coupling. The configuration of FIG. 7b can be viewed as one with an intermediate reduction of noise margin due to coupling between read transistors.

Figure 7C:
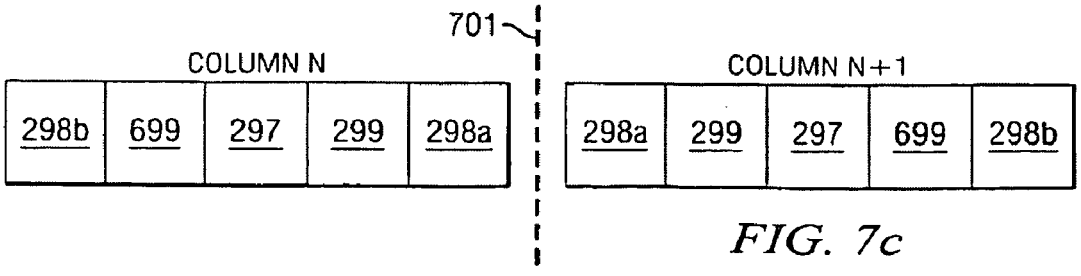

In an advantageous embodiment shown in FIG. 7c, the positions of regions 298b and 699 are also reversed, so that the complementary read transistor 610 is positioned substantially between the second driver transistor 220 and the second load transistor 225. In this manner, no read transistors of one SRAM layout 600 are immediately adjacent to the read transistors of a neighboring SRAM layout 600. This embodiment can be viewed as one with the lowest reduction of noise margin due to coupling between read transistors.

Figure 8:
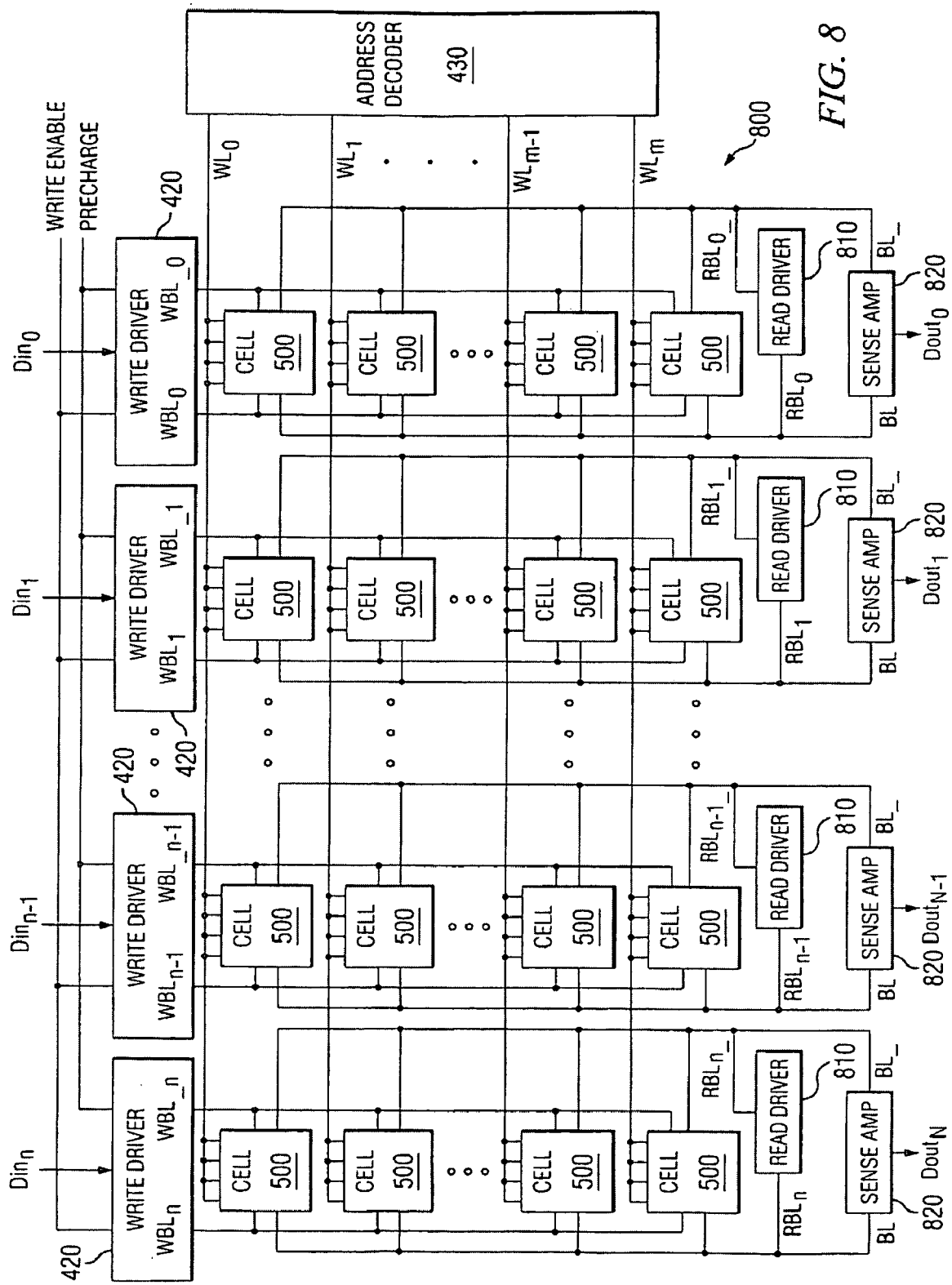
FIG. 8 illustrates a schematic of an SRAM device architecture that utilizes the 10T SRAM cell illustrated in FIG. 5, designed according to the principles of the invention.

Finally, turning to FIG. 8, a schematic of an SRAM device 800 is shown that utilizes the SRAM cell 500. The schematic of FIG. 8 is similar to that of FIG. 4. However, because each SRAM cell 500 has an RBL and an RBL_, two differences are apparent. First, a differential read driver 810 is required to provide circuitry to precharge the states of the RBL and RBL_ lines of each SRAM cell column. Second, a differential sense amplifier 820 is used to convert a differential voltage presented by the RBL and RBL_ lines to a digital value.

Although the present invention has been described in detail, those skilled in the art should understand that they could make various changes, substitutions and alterations herein without departing from the spirit and scope of the invention in its broadest form.

What is claimed is:

1. An SRAM device, comprising:
an array of SRAM cells arranged in rows and columns;
a word line associated with at least one row, said word line operable to solely control access to cells in said row for both read and write;
a write only bit-line associated with at least one column operable to provide input to the cells in said column for write; and
a read only bit-line associated with said at least one column operable to receive output from cells in said column.

2. The SRAM device as recited in claim 1, wherein said each column further comprises a means for precharging said read bit-line.

3. The SRAM device as recited in claim 2, wherein said read bit-line is only precharged in a column selected for read.

4. The SRAM device as recited in claim 2, wherein said read bit-line is only precharged during a read cycle.

5. The SRAM device as recited in claim 2, wherein said read bit-line is allowed to float when not being accessed.

6. The SRAM device as recited in claim 2, wherein said read bit-line has a voltage substantially equal to a source voltage of a read drive transistor when not being accessed.

7. The SRAM device as recited in claim 2, wherein said read bit-line is precharged to $V_{DD}$.

8. The SRAM device as recited in claim 2, wherein said read bit-line is precharged to a voltage lower than $V_{DD}$.

9. The SRAM device as recited in claim 1, further comprising a complementary write bit-line associated with said write bit-line, and said write bit-line is driven low during said write.

10. The SRAM device as recited in claim 1, further comprising a complementary write bit-line associated with said write bit-line, and said write bit-line is driven low while said complementary write bit-line is driven high during said write.

11. The SRAM device as recited in claim 1, further comprising a complementary write bit-line associated with said write bit-line, and said write bit-line is driven lower than a $V_{SS}$ during said write.

12. The SRAM device as recited in claim 1, wherein said array of SRAM cells is an array of 8T SRAM cells.

13. The SRAM device as recited in claim 1, wherein said array of SRAM cells is an array of 10T SRAM cells.

14. The SRAM device as recited in claim 1, wherein a maximum voltage on said write bit-line is $V_{DD}$ for read.

15. The SRAM device as recited in claim 1, wherein a maximum voltage on said write bit-line is $V_{DD}$-$V_{tn}$ for read.

16. The SRAM device as recited in claim 1, further comprising a complementary read bit-line associated with said read bit-line and a differential read driver associated with said complementary read bit-line.

17. The SRAM device as recited in claim 1, further comprising a complementary read bit-line associated with said read bit-line and a differential sense amplifier associated with said complementary read bit-line.

* * * * *